(12) United States Patent
Jung

(10) Patent No.: US 7,358,136 B2
(45) Date of Patent: Apr. 15, 2008

(54) METHOD FOR MANUFACTURING SEMICONDUCTOR DEVICE

(75) Inventor: Tae O. Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 185 days.

(21) Appl. No.: 11/401,891

(22) Filed: Apr. 12, 2006

(65) Prior Publication Data

US 2007/0173001 A1 Jul. 26, 2007

(30) Foreign Application Priority Data

Jan. 23, 2006  (KR) .................. 10-2006-0006984

(51) Int. Cl.
*H01L 21/336* (2006.01)

(52) U.S. Cl. ................ 438/259; 438/197; 438/589

(58) Field of Classification Search ................ 438/167, 438/197, 257, 221, 225, 259, 270, 269, 274, 438/589; 257/E29.321, E21.384, E21.419, 257/E21.428, E21.553
See application file for complete search history.

(56) References Cited

U.S. PATENT DOCUMENTS 6,476,444 B1 * 11/2002 Min ..................... 257/330
7,247,541 B2 * 7/2007 Lee et al. .................. 438/286
2004/0248348 A1 * 12/2004 Rausch et al. ............ 438/197
2004/0259311 A1 * 12/2004 Kim ......................... 438/259
2006/0049455 A1 * 3/2006 Jang et al. ................ 257/330
2006/0246730 A1 * 11/2006 Kim et al. ................ 438/700
2007/0007571 A1 * 1/2007 Lindsay et al. .......... 257/306

FOREIGN PATENT DOCUMENTS

KR   10-2006-0023308 A   3/2006

* cited by examiner

*Primary Examiner*—Kiesha Rose
*Assistant Examiner*—Daniel Whalen
(74) *Attorney, Agent, or Firm*—Townsend and Townsend and Crew LLP

(57) ABSTRACT

A method for manufacturing a semiconductor device includes expanding an active region and a recess region by an epitaxial growth process. As a result, a margin is sufficiently secured in processes for forming a device isolation film that defines the active region and for expanding a recess region to form a bulb recess region.

5 Claims, 9 Drawing Sheets

METHOD FOR MANUFACTURING SEMICONDUCTOR DEVICE

BACKGROUND OF THE INVENTION

1. Field of the Invention

The present invention generally relates to a method for manufacturing a semiconductor device, and more specifically, to a technology of expanding an active region and a recess region by an epitaxial growth process in order not to reduce a process margin in formation of the active region, a device isolation film and a bulb recess region due to reduction of the size of the semiconductor device.

2. Description of the Related Art

Due to high integration of semiconductor devices, the process margin for forming an active region and a device isolation film has been reduced. While the line width of a gate has become narrower and the channel length has become shorter, electric characteristics of the semiconductor device have been degraded. As a result, a recess gate has been used to prevent reduction of the channel length. The recess gate is a technique to etch a semiconductor substrate at a predetermined thickness and increase the contact area between the active region and the gate, thereby increasing the gate channel length.

Meanwhile, while the size of the semiconductor device has become smaller, there is a limit to the increase of the channel length with the recess region. Also, it is difficult to secure a subsequent landing plug contact region. As a result, a bulb recess region is formed to secure the channel length efficiently and also to secure the landing plug contact region sufficiently. However, an etching process is required to be performed twice to form the bulb recess region, and as a result, the process margin is limited.

SUMMARY OF THE INVENTION

Various embodiments are directed at providing a method for manufacturing a semiconductor device to expand an active region and a recess region by an epitaxial growth process so as to secure sufficient margin in processes for forming a device isolation film that defines the active region and for expanding the recess region.

According to an embodiment of the present invention, a method for manufacturing a semiconductor device includes:

etching a gate-location region of a semiconductor substrate to form a recess region having a larger line width than that of the gate;

filling a photoresist film in the recess region;

forming a hard mask pattern having a gate line width in the gate-location region of the semiconductor substrate;

performing an epitaxial growth process on the semiconductor substrate with the hard mask pattern as a barrier;

removing the hard mask pattern and the photoresist pattern so that the recess region becomes a bulb recess region; and forming a gate oxide film over the surface of the semiconductor substrate and then filling a polysilicon layer in the recess region to form a gate in the gate-location region.

Preferably, the recess region has a thickness ranging from 0 to 2000 Å. The hard mask pattern has a deposition structure including a buffer oxide film and a nitride film pattern. The epitaxial growth process is performed to grow an epitaxial growth layer in horizontal and vertical directions at a thickness ranging from 0 to 2000 Å from the semiconductor substrate.

Also, the method further includes forming a photoresist pattern that exposes a C-halo location region over the semiconductor substrate and performing a C-halo ion-implanting process after the epitaxial growth process.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

FIGS. 1a through 1i are cross-sectional diagrams illustrating a method for manufacturing a semiconductor device according to an embodiment of the present invention.

Figure 1A:
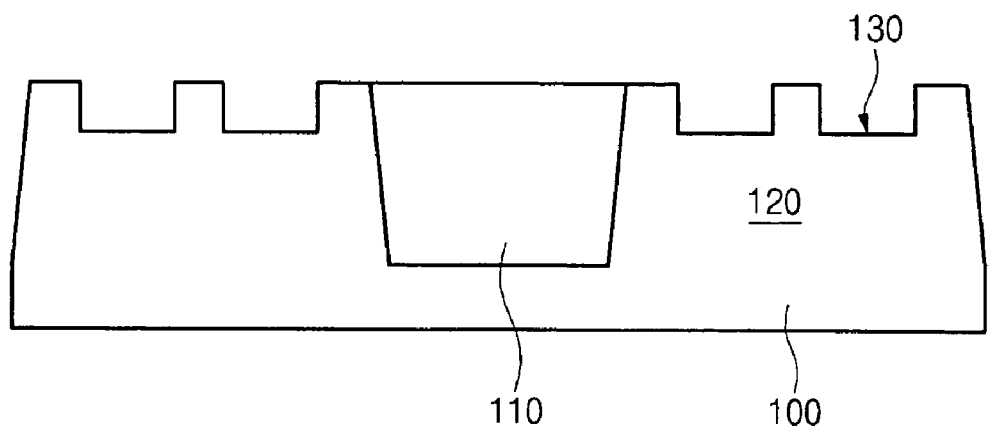
FIGS. 1a through 1i are cross-sectional diagrams illustrating a method for manufacturing a semiconductor device according to an embodiment of the present invention.

Referring to FIG. 1a, a device isolation film 110 that defines an active region 120 is formed in a semiconductor substrate 100. Then, in a region where a gate is to be located (referred to herein as a "gate-location region") is etched in the active region 120 of the semiconductor substrate 100 to form a recess region 130 having a larger line width than that of the gate. Preferably, the device isolation film 110 is formed by a Shallow Trench Isolation (hereinafter, referred to as "STI") process, and the recess region 130 has a thickness ranging from 0 to 2000 Å.

Figure 1B:
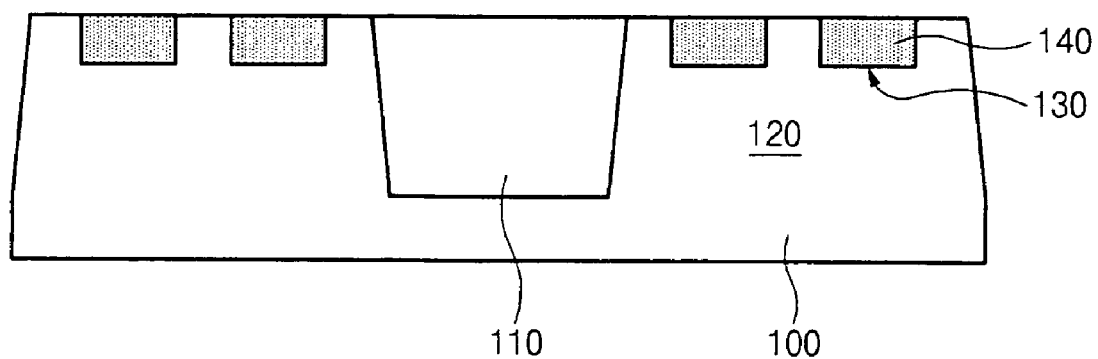

Referring to FIG. 1b, a photoresist film 140 is formed in the recess region 130.

Figure 1C:
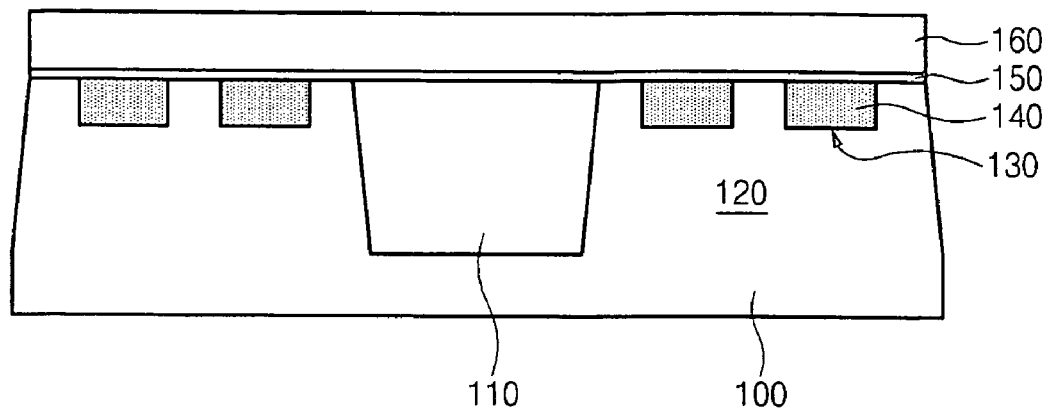

Referring to FIG. 1c, a buffer oxide film 150 and a nitride film 160 are formed over the entire surface of the semiconductor substrate 100.

Figure 1D:
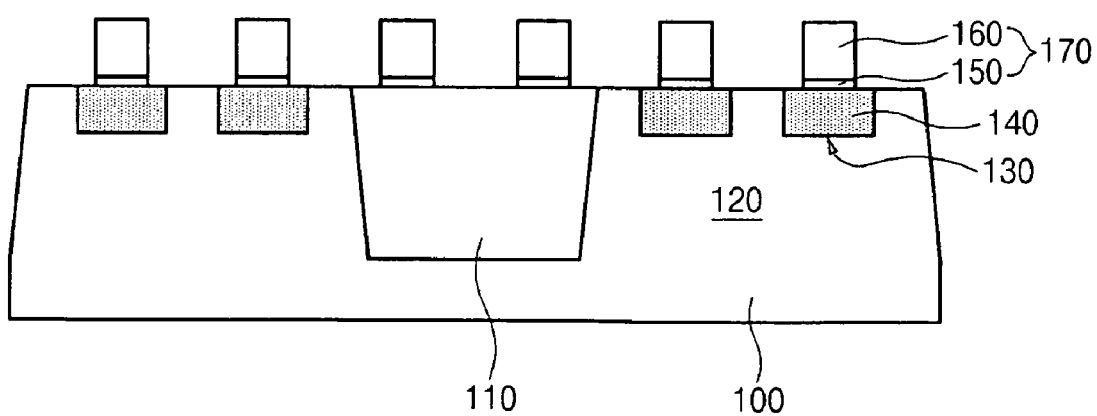

Referring to FIG. 1d, an etching process is performed to sequentially etch the nitride film 160 and the buffer oxide film 150 with a gate mask of the semiconductor substrate 100 to form a hard mask pattern 170 having a gate line width in the gate-location region.

Figure 1E:
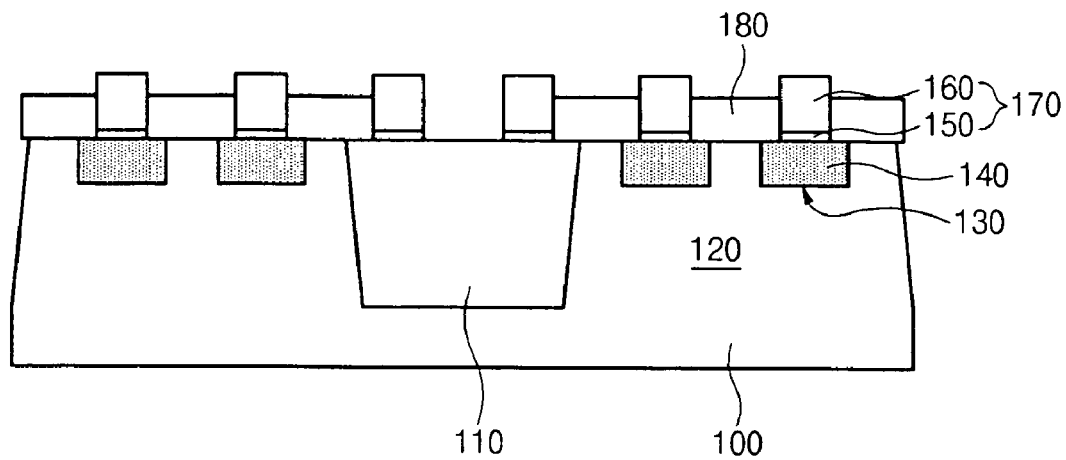

Referring to FIG. 1e, an epitaxial growth process is performed on the semiconductor substrate 100 with the hard mask pattern 170 as a barrier to form an epitaxial growth layer 180. Here, the epitaxial growth layer 180 is grown in horizontal and vertical directions at a thickness ranging from 0 to 2000 Å from the semiconductor substrate 100 to expand the active region 120.

Figure 1F:
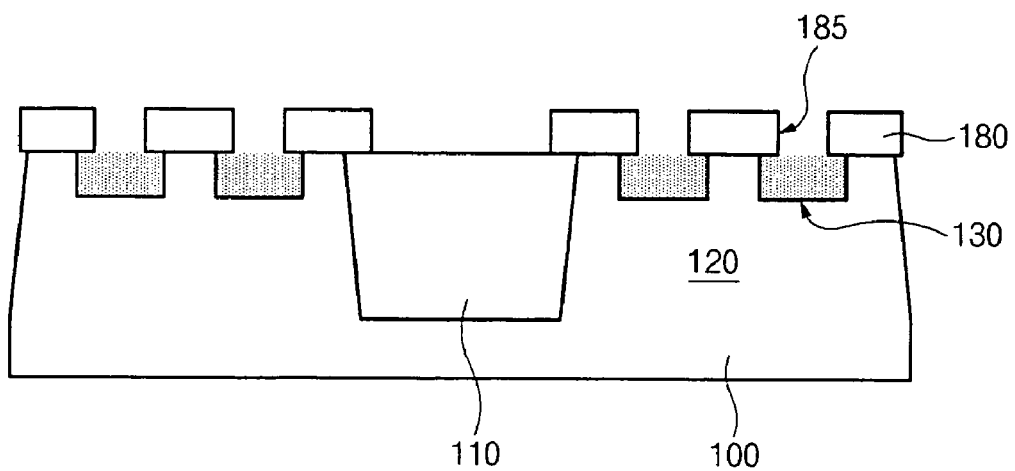

Referring to FIG. 1f, the hard mask pattern 170 and the photoresist film 140 are removed to form a bulb recess region by a region 185 expanded by the recess region 130 and the epitaxial growth layer 180. Here, the recess region 130 becomes a bulb part of the bulb recess region, and the region 185 expanded by the epitaxial growth layer 180 becomes a neck part of the bulb recess region.

Figure 1G:
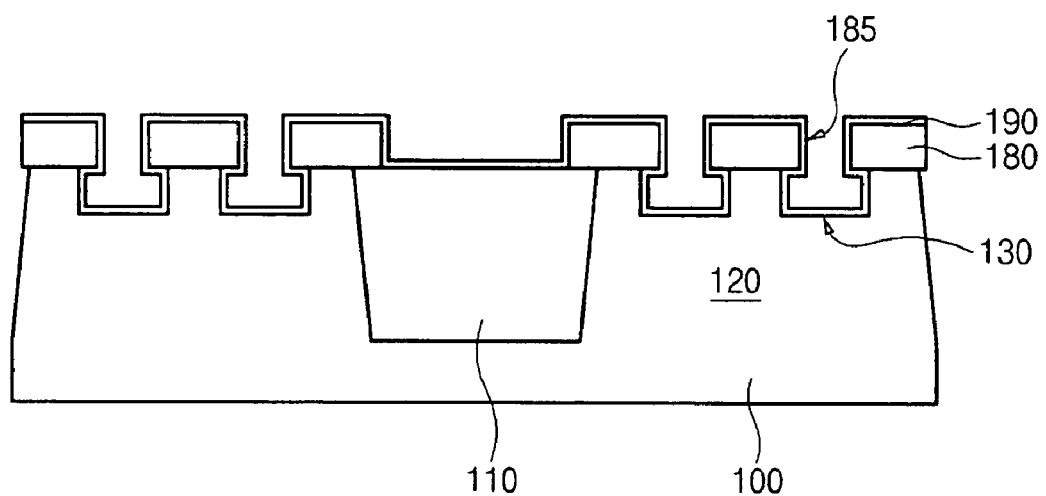

Referring to FIG. 1g, a gate oxide film 190 is formed over the surface of the semiconductor substrate 100.

Figure 1H:
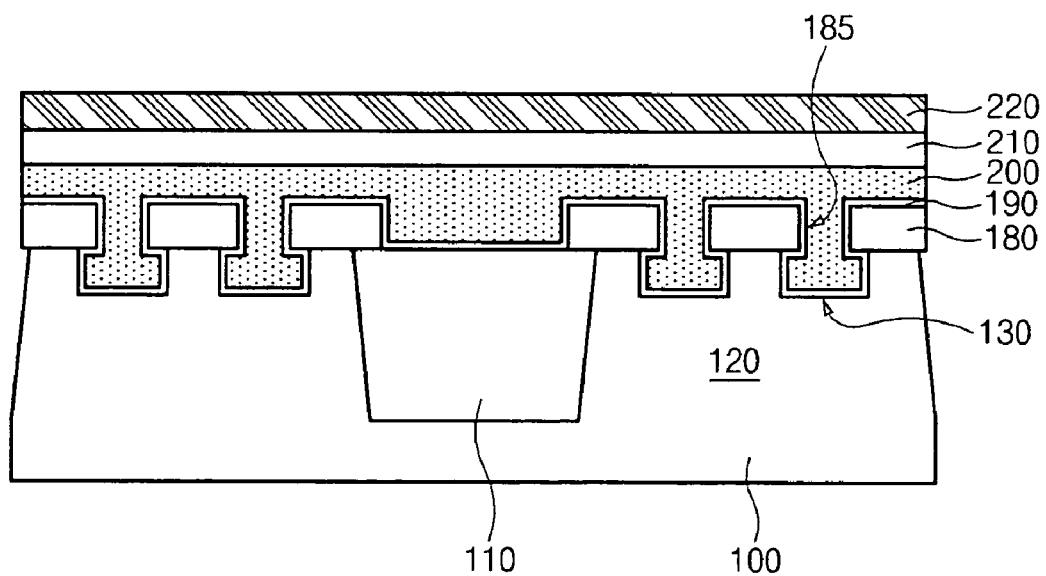

Referring to FIG. 1h, a polysilicon layer 200 is formed over the entire surface of the semiconductor substrate 100, and then a metal layer 210 and a hard mask layer 220 are sequentially deposited thereon.

Figure 1I:
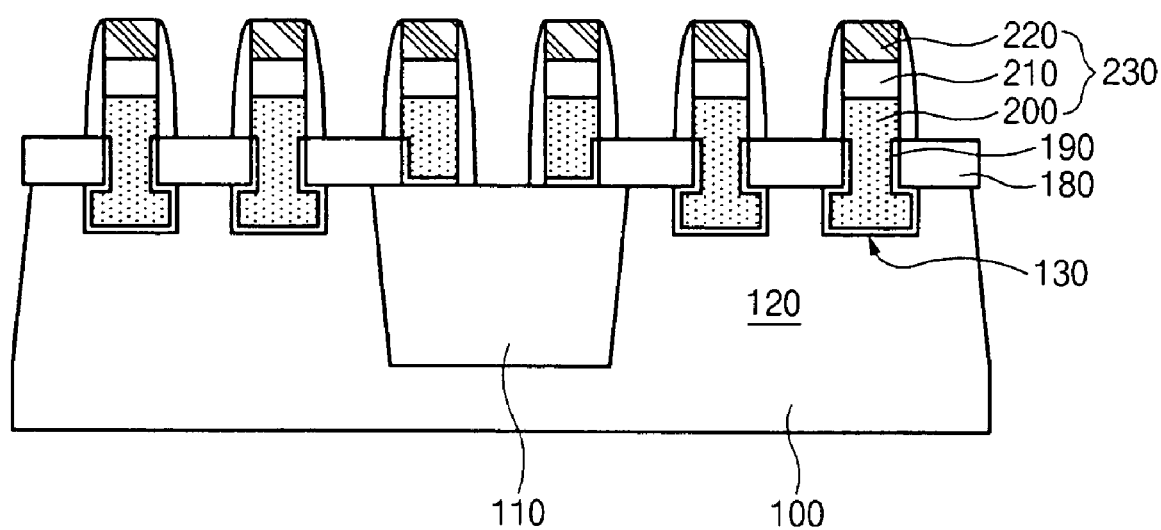

Referring to FIG. 1i, an etching process is performed with a gate mask to form a gate 230. The gate 230 may secure a gate channel length safely by the region 185 expanded by the recess region 130 to have a larger line width than the gate line width and the epitaxial growth layer 180.

FIGS. 2a through 2f are plane diagrams illustrating a method for manufacturing a semiconductor device according to an embodiment of the present invention.

Figure 2A:
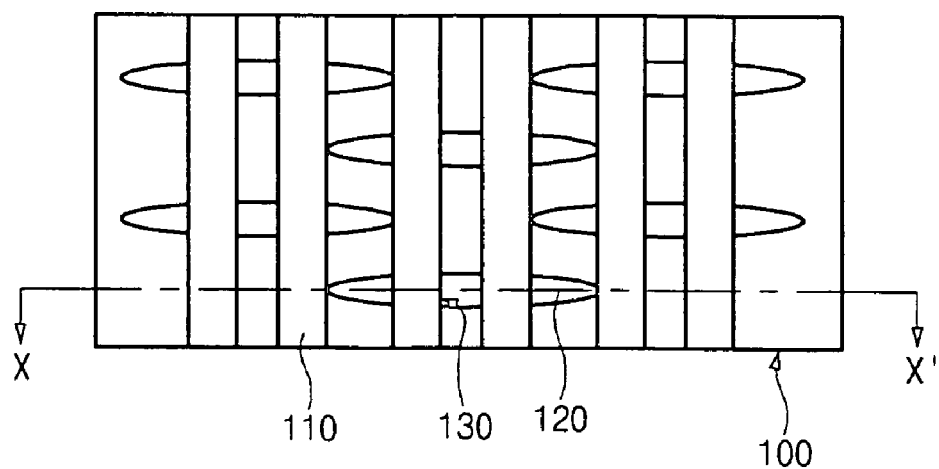
FIGS. 2a through 2f are plane diagrams illustrating a method for manufacturing a semiconductor device according to an embodiment of the present invention.

FIG. 2a is a plane diagram corresponding to FIG. 1a, and FIGS. 1a through 1i are cross-sectional diagrams according to a XX' direction of FIG. 2a. The active region 120 is defined over the semiconductor substrate 100, and the recess region 130 is formed in the active region 120. When the size of the active region 120 increases to improve characteristics of the semiconductor device, the process margin of the device isolation film 110 that defines the active region 120 decreases. Since the active region 120 can be expanded by a subsequent epitaxial growth process in the method for manufacturing a semiconductor device according to an embodiment of the present invention, the device isolation film 110 may be formed while securing a sufficient process margin. Since the recess region 130 may also be expanded by a subsequent epitaxial growth process, it may be formed to have a larger line width than that of the gate.

Figure 2B:
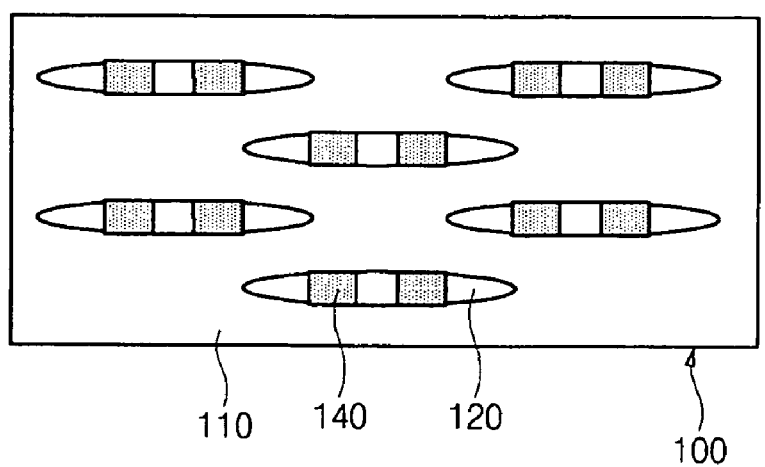

Referring to FIG. 2b, the photoresist film 140 is filled in the recess region 130.

Figure 2C:
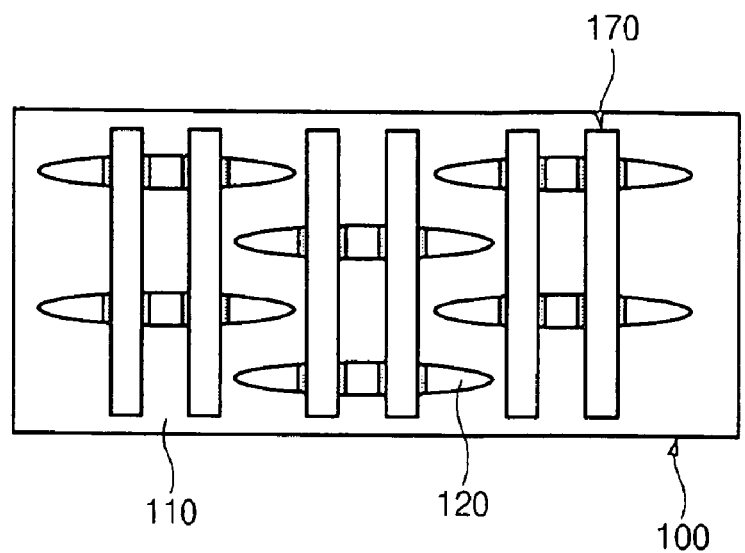

Referring to FIG. 2c, the hard mask pattern 170 is formed in the gate-location region.

Figure 2D:
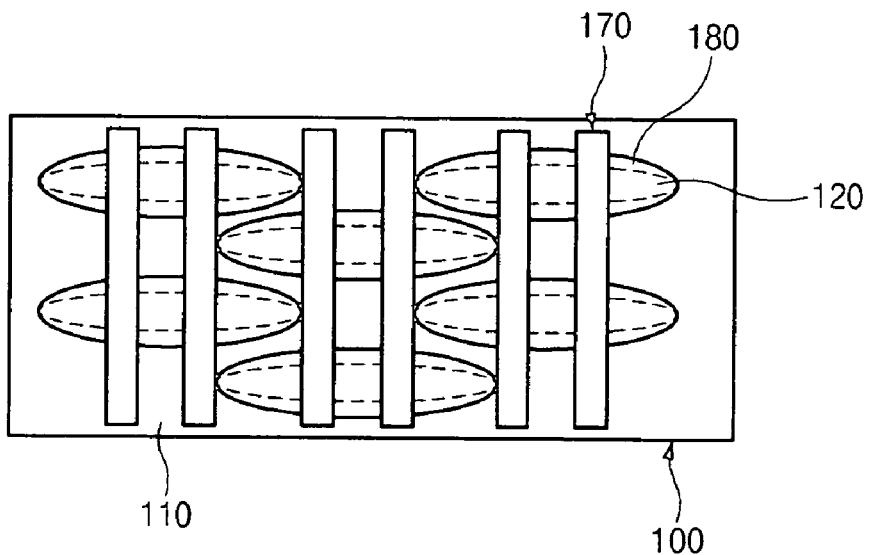

Referring to FIG. 2d, the epitaxial growth process is performed to form the epitaxial growth layer 180, thereby expanding the active region 120 and the recess region 130.

Figure 2E:
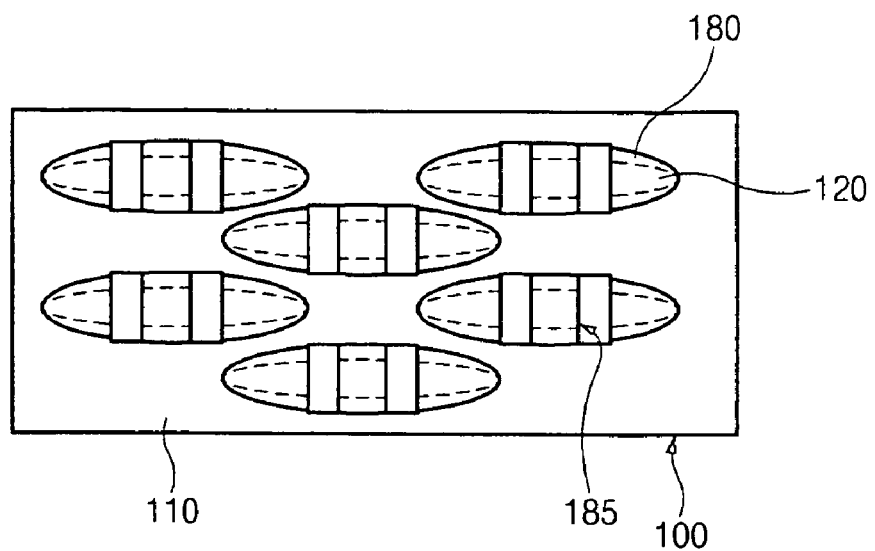

Referring to FIG. 2e, the hard mask pattern 170 and the photoresist film 140 are removed. This leaves the epitaxial growth layer 180 and a region 185 expanded by the recess region 130 and the epitaxial growth layer 180.

Figure 2F:
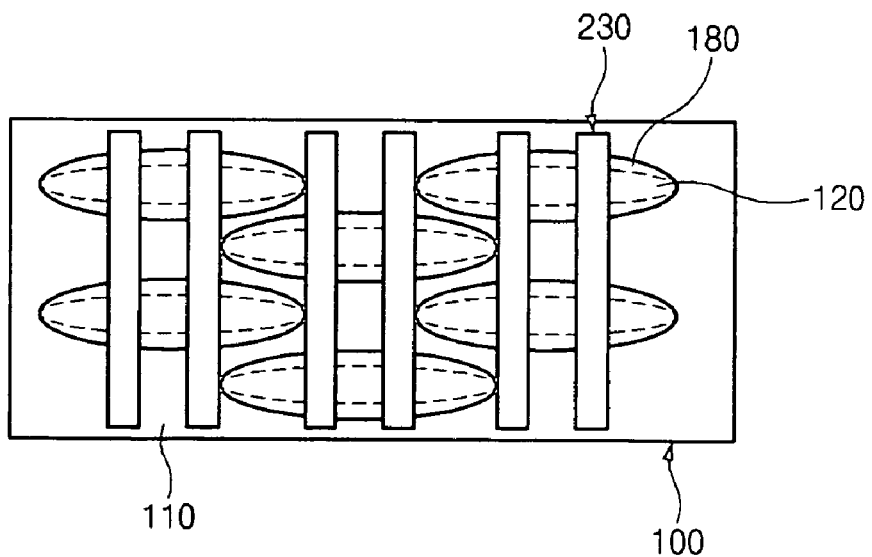

Referring to FIG. 2f, the gate 230 is formed over the region 185 expanded by the recess region 130 and the epitaxial growth layer 180.

Figure 3:
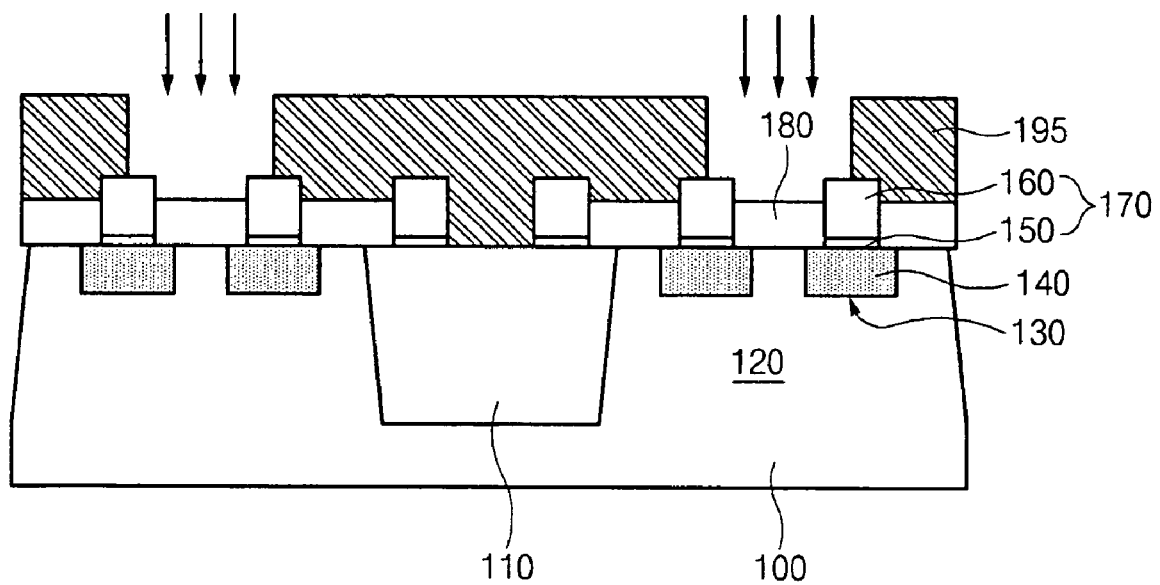
FIG. 3 is a cross-sectional diagram illustrating a C-halo ion-implanting process of the method for manufacturing a semiconductor device according to an embodiment of the present invention.

FIG. 3 is a cross-sectional diagram illustrating a C-halo ion-implanting process of the method for manufacturing a semiconductor device according to an embodiment of the present invention.

Referring to FIG. 3, the hard mask pattern 170 formed in the step of FIGS. 1e and 2d is formed in the gate-location region. Thus, a photoresist pattern 195 that exposes a C-halo ion-implanting region between gates is formed over the semiconductor substrate 100. Here, the C-halo ion-implanting process is a bit line contact location region. Then, a C-halo ion-implanting process is performed with the photoresist pattern 195. Since the aspect ratio of the hard mask pattern 170 is relatively smaller than that of a subsequent gate, the photoresist pattern is prevented from collapsing and voids are prevented from being generated due to residuals and gap fill while a conventional C-halo ion-implanting mask pattern is formed.

As described above, in a method for manufacturing a semiconductor device according to an embodiment of the present invention, a margin can be sufficiently secured in processes for forming a device isolation film that defines an active region and for expanding a recess region to form a bulb recess region by an epitaxial growth process. Also, a C-halo ion-implanting process is safely performed with a hard mask pattern having a gate shape not after a gate is formed but after an epitaxial growth process is performed.

Accordingly, in a method for manufacturing a semiconductor device according to an embodiment of the present invention, an epitaxial growth process is performed with a hard mask pattern having a gate shape after a recess region is formed to expand an active region and a recess region. A process margin can be sufficiently secured when a device isolation film that defines an active region is formed because the active region is expanded, and a process margin can also be sufficiently secured when a bulb recess region is formed because a recess region is expanded. Additionally, a C-halo ion-implanting process can be safely performed because it is performed after an epitaxial growth process. As a result, a process for forming a device isolation film can be safely performed, and an active region and a recess region are expanded to secure a subsequent landing plug contact area, thereby improving resistance and a refresh characteristic.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device, the method comprising:

etching a gate-location region of a semiconductor substrate to form a recess region having a larger line width than that of a gate to be formed in the gate-location region;

filling a photoresist film in the recess region;

forming a hard mask pattern having a gate line width in the gate-location region of the semiconductor substrate;

performing an epitaxial growth process on the semiconductor substrate with the hard mask pattern as a barrier;

removing the hard mask pattern and the photoresist pattern so that the recess region becomes a bulb recess region; and forming a gate oxide film over the semiconductor substrate and then filling a polysilicon layer in the recess region to form the gate in the gate-location region.

2. The method according to claim 1, wherein the recess region has a thickness ranging from 0 to 2000 Å.

3. The method according to claim 1, wherein the hard mask pattern has a deposition structure including a buffer oxide film and a nitride film pattern.

4. The method according to claim 1, wherein the epitaxial growth process is performed to grow an epitaxial growth layer in horizontal and vertical directions at a thickness ranging from 0 to 2000 Å from the semiconductor substrate.

5. The method according to claim 1, further comprising forming a photoresist pattern that exposes a C-halo location region over the semiconductor substrate and performing a C-halo ion-implanting process after the epitaxial growth process.

* * * * *